(12) United States Patent
Kim et al.

(10) Patent No.: US 8,022,762 B2
(45) Date of Patent: Sep. 20, 2011

(54) MULTI-STAGE CMOS POWER AMPLIFIER

(75) Inventors: Youn Suk Kim, Gyunggi-do (KR); Hyo Gun Bae, Seoul (KR); Joong Jin Nam, Seoul (KR); Jun Goo Won, Gyunggi-do (KR); Ki Joong Kim, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/823,420

(22) Filed: Jun. 25, 2010

(65) Prior Publication Data

US 2011/0102084 A1    May 5, 2011

(30) Foreign Application Priority Data

Nov. 2, 2009    (KR) .................. 10-2009-0104992

(51) Int. Cl.
*H03F 1/00*    (2006.01)
(52) U.S. Cl. ........................ 330/165; 330/276
(58) Field of Classification Search .................. 330/165, 330/124 R, 310, 150, 98, 276
See application file for complete search history.

(56) References Cited

U.S. PATENT DOCUMENTS

| | | | |
|---|---|---|---|
| 4,383,222 A * | 5/1983 | Morong, III | ............. 330/9 |
| 6,737,916 B2 * | 5/2004 | Luu | ............. 330/10 |
| 6,788,141 B2 | 9/2004 | Paul et al. | |
| 7,629,852 B2 * | 12/2009 | Floyd et al. | ............. 330/305 |

FOREIGN PATENT DOCUMENTS

| | | |
|---|---|---|
| JP | 2000332542 A | 11/2000 |
| JP | 2003023328 A | 1/2003 |
| KR | 90-17887 | 10/1990 |

OTHER PUBLICATIONS

Korean Office Action for Application No. 10-2009-0104992, issued Jan. 28, 2011.

* cited by examiner

*Primary Examiner* — Henry Choe
(74) *Attorney, Agent, or Firm* — Lowe, Hauptman, Ham & Berner, LLP

(57) ABSTRACT

There is provided a multi-stage CMOS power amplifier including: a driver amplifier having differential output terminals, inverting differential signals input through first and second input terminals and outputting the respective inverted signals through the differential output terminals; a transformer for power matching having a primary coil connected between the differential output terminals of the driver amplifier and a secondary coil coupled with the primary coil using electromagnetic induction, having a predetermined turns ratio to the primary coil, and connected to a direct current (DC) tuning voltage terminal; and a power amplifier power-amplifying differential signals passing through one end and the other end of the secondary coil of the transformer and outputting the respective power-amplified differential signals through first and second output terminals.

16 Claims, 4 Drawing Sheets

MULTI-STAGE CMOS POWER AMPLIFIER

CROSS-REFERENCE TO RELATED APPLICATIONS

This application claims the priority of Korean Patent Application No. 10-2009-0104992 filed on Nov. 2, 2009, in the Korean Intellectual Property Office, the disclosure of which is incorporated herein by reference.

BACKGROUND OF THE INVENTION

1. Field of the Invention

The present invention relates to a multi-stage complementary metal oxide semiconductor (CMOS) power amplifier applicable to a mobile communications system such as a mobile phone, and more particularly, to a multi-stage CMOS power amplifier having enhanced power efficiency by improving power matching among plural amplifiers included in the multi-stage CMOS power amplifier.

2. Description of the Related Art

Generally, in order to extend continuous call time in a mobile phone, the efficiency of a power amplifier that amplifies microwaves sent to a base station is very important. In this regard, a multi-stage power amplifier in which plural power amplifiers are connected in a cascade may be used.

Also, when a power amplifier for a mobile phone is designed by using a complementary metal oxide semiconductor (CMOS) process widely used in a specific GaAs semiconductor production process, it can be mass produced. Accordingly, there are the advantages of reduced production costs and multi functionality.

A conventional multi-stage CMOS power amplifier, as mentioned above, may be configured in such a manner that plural power amplifiers are connected in a cascade.

More specifically, the conventional multi-stage CMOS power amplifier may include a driver amplifier and a power amplifier, for example, each of which has a differential configuration such that each amplifies signals having different phases.

Each of the amplifiers included in the power amplifier having a differential configuration may include at least one metal oxide semiconductor (MOS) transistor in order to amplify an input alternating voltage.

In such a conventional multi-stage CMOS power amplifier, however, since the MOS transistor included in the power amplifier performs turn-on and turn-off operations on the basis of an alternating voltage of 0.4V, when the input alternating voltage is above 0.8V, voltage waveform is distorted. Accordingly, the amplifying rate is reduced, and thus power efficiency is degraded.

SUMMARY OF THE INVENTION

An aspect of the present invention provides a multi-stage complementary metal oxide semiconductor (CMOS) power amplifier allowing for enhanced power efficiency by improving power matching among plural amplifiers included in the multi-stage CMOS power amplifier.

According to an aspect of the present invention, there is provided a multi-stage CMOS power amplifier including: a driver amplifier having differential output terminals, inverting differential signals input through first and second input terminals and outputting the respective inverted signals through the differential output terminals; a transformer for power matching having a primary coil connected between the differential output terminals of the driver amplifier and a secondary coil coupled with the primary coil using electromagnetic induction, having a predetermined turns ratio to the primary coil, and connected to a direct current (DC) tuning voltage terminal; and a power amplifier power-amplifying differential signals passing through one end and the other end of the secondary coil of the transformer and outputting the respective power-amplified differential signals through first and second output terminals.

The driver amplifier may include a first inverter connected between a first operating voltage terminal and a ground and inverting a first input signal input through the first input terminal, and a second inverter connected between the first operating voltage terminal and the ground and inverting a second input signal input through the second input terminal.

The primary coil of the transformer may be connected between output terminals of the first and second inverters and the secondary coil of the transformer may have the predetermined turns ratio to the primary coil and converts power generated from the primary coil according to the predetermined turns ratio.

The power amplifier may include a first amplifier connected between a second operating voltage terminal and a ground, amplifying a signal passing through the one end of the secondary coil of the transformer, and outputting the amplified signal through the first output terminal; and a second amplifier connected between the second operating voltage terminal and the ground, amplifying a signal passing through the other end of the secondary coil of the transformer, and outputting the amplified signal through the second output terminal.

The transformer may have the tuning voltage terminal connected to an intermediate node of the secondary coil.

The first inverter may include a first p-channel metal oxide semiconductor (PMOS) transistor having a source connected to the first operating voltage terminal, a gate connected to the first input terminal, and a drain connected to the output terminal of the first inverter; and a first n-channel metal oxide semiconductor (NMOS) transistor having a drain connected to the output terminal of the first inverter, a gate connected to the first input terminal, and a source connected to the ground.

When the first PMOS transistor is turned on according to the first input signal input through the first input terminal, the first NMOS transistor is turned off according to the first input signal input through the first input terminal. When the first PMOS transistor is turned off according to the first input signal input through the first input terminal, the first NMOS transistor is turned on according to the first input signal input through the first input terminal.

The second inverter may include a second PMOS transistor having a source connected to the first operating voltage terminal, a gate connected to the second input terminal, and a drain connected to the output terminal of the second inverter; and a second NMOS transistor having a drain connected to the output terminal of the second inverter, a gate connected to the second input terminal, and a source connected to the ground.

When the second PMOS transistor is turned on according to the second input signal input through the second input terminal, the second NMOS transistor is turned off according to the second input signal input through the second input terminal. When the second PMOS transistor is turned off according to the second input signal input through the second input terminal, the second NMOS transistor is turned on according to the second input signal input through the second input terminal.

Each of the first and second amplifiers may have a cascode configuration including two amplifiers.

The first amplifier may include a third NMOS transistor having a gate connected to the one end of the secondary coil of the transformer, a drain and a source connected to the ground; and a fourth NMOS transistor having a drain connected to the second operating voltage terminal and the first output terminal, a gate connected to a predetermined first bias voltage terminal, and a source connected to the drain of the third NMOS transistor.

The second amplifier may include a fifth NMOS transistor having a gate connected to the other end of the secondary coil of the transformer, a drain, and a source connected to the ground; and a sixth NMOS transistor having a drain connected to the second operating voltage terminal and the second output terminal, a gate connected to a predetermined second bias voltage terminal, and a source connected to the drain of the fifth NMOS transistor.

A tuning voltage may be set to have the same voltage level as a turn-on voltage of the third and fifth NMOS transistors.

A first operating voltage may be set to have the same voltage level as a second operating voltage.

First and second bias voltages may be set to have a voltage level higher than a turn-on voltage of the fourth and sixth NMOS transistors.

A tuning voltage may be set to have the same voltage level as half of that of a peak-to-peak voltage of each of the signals respectively output through the one end and the other end of the secondary coil of the transformer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
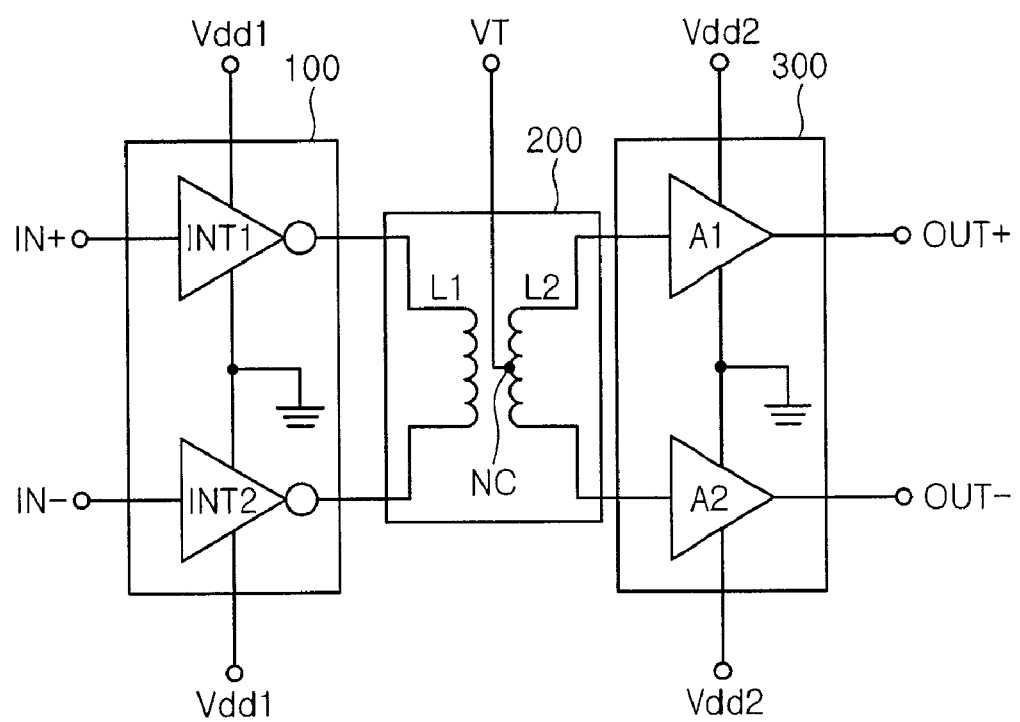
FIG. 1 is a circuit diagram illustrating a multi-stage complementary metal oxide semiconductor (CMOS) power amplifier according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

FIG. 1 is a circuit diagram illustrating a multi-stage complementary metal oxide semiconductor (CMOS) power amplifier according to an exemplary embodiment of the present invention.

Referring to FIG. 1, a multi-stage CMOS power amplifier according to this embodiment may include a driver amplifier 100, a transformer 200 for power matching, and a power amplifier 300. The driver amplifier 100 including differential output terminals inverts differential signals input through first and second input terminals IN+ and IN− and outputs the respective inverted signals through the differential output terminals. The transformer 200 includes a primary coil L1 connected between the differential output terminals of the driver amplifier 100 and a secondary coil L2 coupled with the primary coil L1 using electromagnetic induction, in which the primary coil L1 and the secondary coil L2 have a predetermined turns ratio therebetween and a direct current (DC) tuning voltage terminal VT is connected to the secondary coil L2. The power amplifier 300 power-amplifies differential signals passing through one end and the other end of the secondary coil L2 of the transformer 200 and outputs the respective power-amplified differential signals through first and second output terminals OUT+ and OUT−.

The driver amplifier 100 may include a first inverter INT1 and a second inverter INT2. The first inverter INT1 is connected between a first operating voltage terminal Vdd1 and a ground and inverts a first input signal input through the first input terminal IN+. The second inverter INT2 is connected between the first operating voltage terminal Vdd1 and the ground and inverts a second input signal input through the second input terminal IN−.

The primary coil L1 of the transformer 200 is connected between the output terminals of the first and second inverters INT1 and INT2. The secondary coil L2 of the transformer 200, having the predetermined turns ratio to the primary coil L1, converts power generated from the primary coil L1 according to the predetermined turns ratio.

The power amplifier 300 may include a first amplifier A1 and a second amplifier A2. The first amplifier A1 is connected between a second operating voltage terminal Vdd2 and a ground, amplifies a signal passing through one end of the secondary coil L2 of the transformer 200, and outputs the amplified signal through the first output terminal OUT+. The second amplifier A2 is connected between the second operating voltage terminal Vdd2 and the ground, amplifies a signal passing through the other end of the secondary coil L2 of the transformer 200, and outputs the amplified signal through the second output terminal OUT−.

In order to further enhance power efficiency, the transformer 200 may have the tuning voltage terminal VT connected to an intermediate node NC of the secondary coil L2.

Figure 2:
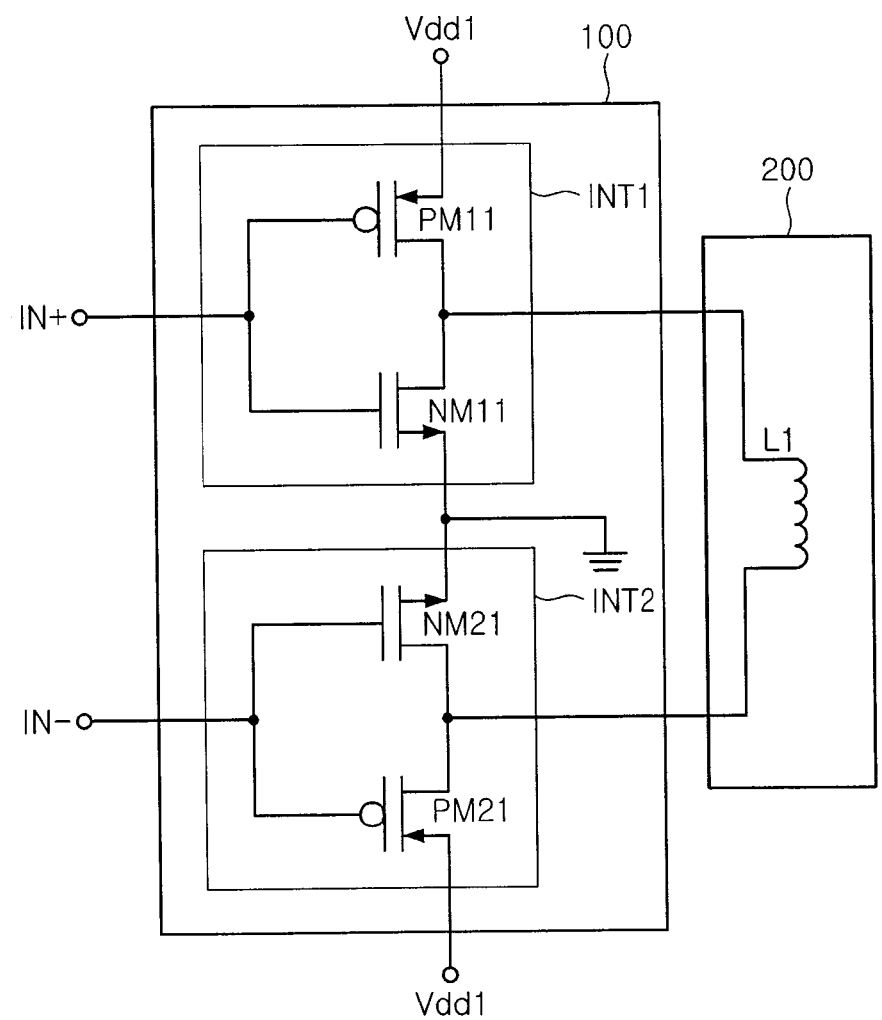
FIG. 2 is a circuit diagram illustrating a driver amplifier according to an exemplary embodiment of the present invention.

FIG. 2 is a circuit diagram illustrating a driver amplifier according to an exemplary embodiment of the present invention.

Referring to FIG. 2, the first inverter INT1 may include a first p-channel metal oxide semiconductor (PMOS) transistor PM11 and a first n-channel metal oxide semiconductor (NMOS) transistor NM11. The first PMOS transistor PM11 has a source connected to the first operating voltage terminal Vdd1, a gate connected to the first input terminal IN+, and a drain connected to the output terminal of the first inverter INT1. The first NMOS transistor NM11 has a drain connected to the output terminal of the first inverter INT1, a gate connected to the first input terminal IN+, and a source connected to the ground.

When the first PMOS transistor PM11 is turned on according to the first input signal input through the first input terminal IN+, the first NMOS transistor NM11 is turned off according to the first input signal input through the first input terminal IN+. When the first PMOS transistor PM11 is turned off according to the first input signal input through the first input terminal IN+, the first NMOS transistor NM11 is turned on according to the first input signal input through the first input terminal IN+.

The second inverter INT2 may include a second PMOS transistor PM21 and a second NMOS transistor NM21. The second PMOS transistor PM21 has a source connected to the first operating voltage terminal Vdd1, a gate connected to the second input terminal IN−, and a drain connected to the output terminal of the second inverter INT2. The second NMOS transistor NM21 has a drain connected to the output terminal of the second inverter INT2, a gate connected to the second input terminal IN−, and a source connected to the ground.

When the second PMOS transistor PM21 is turned according to by the second input signal input through the second input terminal IN−, the second NMOS transistor NM21 is turned off according to the second input signal input through the second input terminal IN−. When the second PMOS transistor PM21 is turned off according to the second input signal input through the second input terminal IN−, the second NMOS transistor NM21 is turned on according to the second input signal input through the second input terminal IN−.

Figure 3:
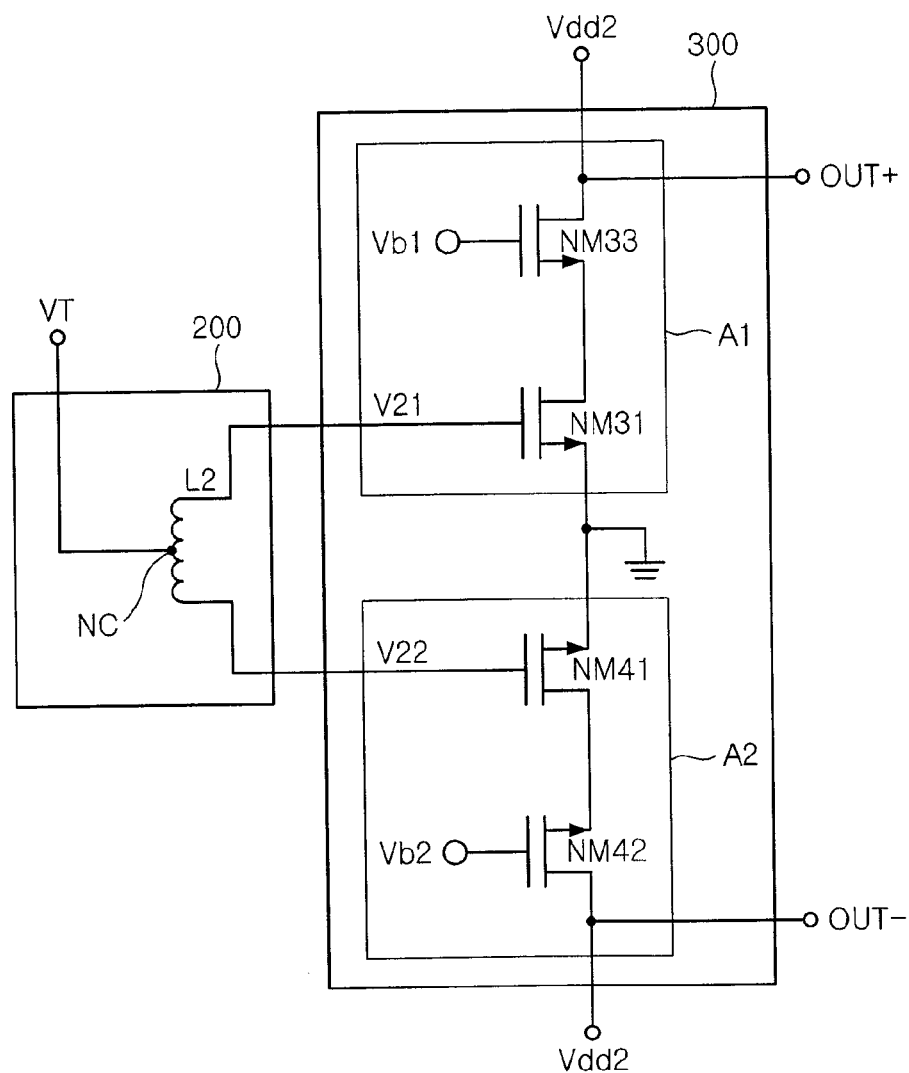
FIG. 3 is a circuit diagram illustrating a power amplifier according to an exemplary embodiment of the present invention.

FIG. 3 is a circuit diagram illustrating a power amplifier according to an exemplary embodiment of the present invention.

Referring to FIG. 3, the first amplifier A1 may include a third NMOS transistor NM31 and a fourth NMOS transistor NM32. The third NMOS transistor NM31 has a gate connected to one end of the secondary coil L2 of the transformer 200, a drain and a source connected to the ground. The fourth NMOS transistor NM32 has a drain connected to the second operating voltage terminal Vdd2 and the first output terminal OUT+, a gate connected to a predetermined first bias voltage terminal Vb1, and a source connected to the drain of the third NMOS transistor NM31.

The second amplifier A2 may include a fifth NMOS transistor NM41 and a sixth NMOS transistor NM42. The fifth NMOS transistor NM41 has a gate connected to the other end of the secondary coil L2 of the transformer 200, a drain, and a source connected to the ground. The sixth NMOS transistor NM42 has a drain connected to the second operating voltage terminal Vdd2 and the second output terminal OUT−, a gate connected to a predetermined second bias voltage terminal Vb2, and a source connected to the drain of the fifth NMOS transistor NM41.

As described above, each of the first and second amplifiers A1 and A2 of the power amplifier 300 may have a cascode configuration including two amplifiers.

Meanwhile, a tuning voltage VT may be set to have the same voltage level as a turn-on voltage of the third and fifth NMOS transistors NM31 and NM41. A first operating voltage Vdd1 may be set to have the same voltage level as a second operating voltage Vdd2. First and second bias voltages Vb1 and Vb2 may be set to have a voltage level higher than a turn-on voltage of the fourth and sixth NMOS transistors NM32 and NM42.

Also, the tuning voltage VT may be set to have the same voltage level as half of that of a peak-to-peak voltage Vpp of each of the signals respectively output through one end and the other end of the secondary coil L2 of the transformer 200.

Figure 4:
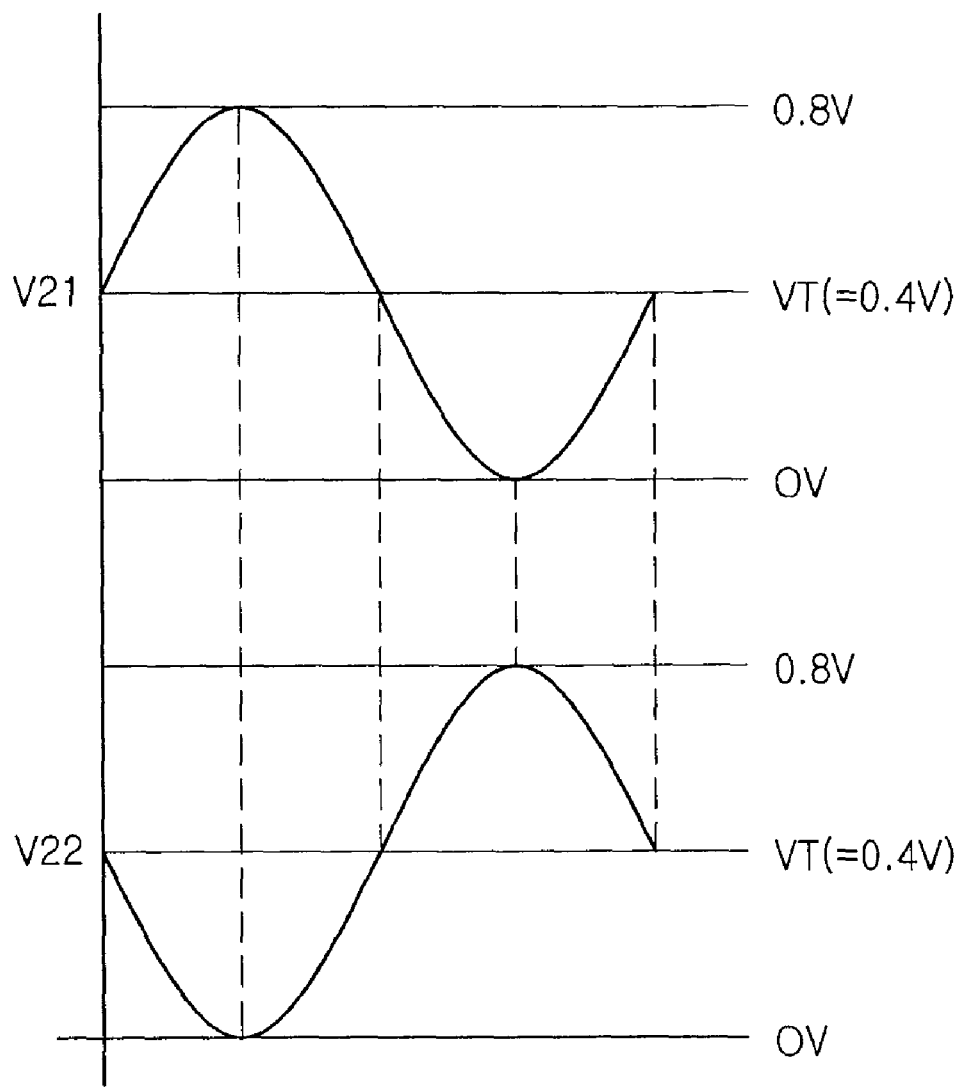
FIG. 4 is a view illustrating the waveforms of differential pressure signals of a power amplifier according to an exemplary embodiment of the present invention.

FIG. 4 is a view illustrating the waveforms of differential pressure signals of a power amplifier according to an exemplary embodiment of the present invention. In FIG. 4, V21 represents the waveform of the voltage input through the gate of the third NMOS transistor NM31 of the first amplifier A1, and V22 represents the waveform of the voltage input through the gate of the fifth NMOS transistor NM41 of the second amplifier A2.

V21 and V22 are differential signals having a phase difference of 180 degrees.

Hereinafter, the operation and effect of the present invention will be described in detail with reference to the accompanying drawings.

Referring to FIGS. 1 through 4, a detailed description of a multi-stage CMOS power amplifier according to the present invention is provided. In FIG. 1, the driver amplifier 100 of the multi-stage CMOS power amplifier inverts differential signals that are input through the first and second input terminals IN+ and IN− and outputs the respective inverted differential signals to the transformer 200 for power matching through the differential output terminals.

More specifically, when the driver amplifier 100 has a differential configuration including the first and second inverters INT1 and INT2, the first inverter INT1 inverts a first input signal input through the first input terminal IN+ and outputs the inverted signal to one end of the primary coil L1 of the transformer 200, and the second inverter INT2 inverts a second input signal input through the second input terminal IN− and outputs the inverted signal to the other end of the primary coil L1 of the transformer 200.

Next, the transformer 200 transmits the signals, passing through the primary coil L1 connected between the differential output terminals of the driver amplifier 100, to the power amplifier 300 through one end and the other end of the secondary coil L2 by causing the primary coil L1 to be coupled to the secondary coil L2 using electromagnetic induction.

More specifically, the primary coil L1 of the transformer 200 is connected between the output terminals of the first and second inverters INT1 and INT2. The secondary coil L2 of the transformer 200 has a predetermined turns ratio to the primary coil L1, converts power generated from the primary coil L1 according to the predetermined turns ratio, and transmits the converted power to the power amplifier 300.

The tuning voltage terminal VT is connected to the intermediate node NC of the secondary coil L2. Here, a tuning voltage VT may be set to have the same voltage level as half of that of a peak-to-peak voltage Vpp of each of the signals respectively output through one end and the other end of the secondary coil L2 of the transformer 200.

For example, as shown in FIG. 4, assuming that the peak-to-peak voltage Vpp of each of the signals, input into the gates of the third and fifth NMOS transistors NMOS31 and NMOS41 of the power amplifier 300 through one end and the other end of the secondary coil L2, respectively, ranges from 0V to 0.8V, when the tuning voltage VT is set to 0.4V, each of the signals respectively output through one end and the other end of the secondary coil L2 has a swing upwards and downwards on the basis of 0.4V without distortion.

That is, since signal distortion by the third and fifth NMOS transistors NMOS31 and NMOS41 does not occur due to the transformer connected between the driver amplifier and the power amplifier, the power efficiency of the transformer may be improved as compared with the amplifiers causing signal distortion.

The tuning voltage VT may be set to have the same voltage level as a turn-on voltage of the third and fifth NMOS transistors NM31 and NM41.

The power amplifier 300 power-amplifies differential signals passing through one end and the other end of the secondary coil L2 of the transformer 200 and outputs the respective power-amplified differential signals through the first and second output terminals OUT+ and OUT−.

More specifically, when the power amplifier 300 has a differential configuration including the first and second amplifiers A1 and A2, the first amplifier A1 amplifies the signal passing through one end of the secondary coil L2 of the transformer 200 and outputs the amplified signal to the first output terminal OUT+, and the second amplifier A2 amplifies the signal passing through the other end of the secondary coil L2 of the transformer 200 and outputs the amplified signal to the second output terminal OUT−.

In order to further enhance power efficiency, the transformer 200 may have the tuning voltage terminal VT connected to the intermediate node NC of the secondary coil L2.

Referring to FIG. 2, the first and second inverters INT1 and INT2 of the driver amplifier 100 will be described in detail.

As shown in FIG. 2, the first inverter INT1 may include the first PMOS transistor PM11 and the first NMOS transistor NM11.

When the first PMOS transistor PM11 is turned on according to the first input signal input through the first input terminal IN+, the first NMOS transistor NM11 is turned off according to the first input signal input through the first input terminal IN+.

In contrast, when the first PMOS transistor PM11 is turned off according to the first input signal input through the first input terminal IN+, the first NMOS transistor NM11 is turned on according to the first input signal input through the first input terminal IN+.

Also, as shown in FIG. 2, the second inverter INT2 may include the second PMOS transistor PM21 and the second NMOS transistor NM21.

When the second PMOS transistor PM21 is turned on according to the second input signal input through the second input terminal IN−, the second NMOS transistor NM21 is turned off according to the second input signal input through the second input terminal IN−.

In contrast, when the second PMOS transistor PM21 is turned off according to the second input signal input through the second input terminal IN−, the second NMOS transistor NM21 is turned on according to the second input signal input through the second input terminal IN−.

Referring to FIG. 3, the first and second amplifiers A1 and A2 of the power amplifier 300 will be described in detail.

As shown in FIG. 3, the first amplifier A1 may have a cascode configuration including the third and fourth NMOS transistors NM31 and NM32. Here, the fourth NMOS transistor NM32 is turned on by a first bias voltage Vb1, and the third NMOS transistor NM31 amplifies a signal V21 as shown in FIG. 4 and causes the amplified signal to pass through the fourth NMOS transistor NM32 and be output through the first output terminal OUT+.

Also, the second amplifier A2 may have a cascode configuration including the fifth and sixth NMOS transistors NM41 and NM42. Here, the sixth NMOS transistor NM42 is turned on by a second bias voltage Vb2, and the fifth NMOS transistor NM41 amplifies a signal V22 as shown in FIG. 4 and causes the amplified signal to pass through the sixth NMOS transistor NM42 and be output through the second output terminal OUT−.

Here, the first and second bias voltage Vb1 and Vb2 may be set to have a voltage level higher than a turn-on voltage of the fourth and sixth NMOS transistors NM32 and NM42.

A first operating voltage Vdd1 may be set to have the same voltage level as a second operating voltage Vdd2. In this case, a single power circuit is required, whereby the manufacturing process thereof is simplified and the manufacturing cost is reduced.

In addition, when the first and second bias voltages Vb1 and Vb2 are set to have the same voltage level as the first and second operating voltages Vdd1 and Vdd2, all of them, i.e., the first and second operating voltages Vdd1 and Vdd2 as well as the first and second bias voltages Vb1 and Vb2 may be supplied by only one power circuit.

According to the present invention, the power matching among plural amplifiers included in a multi-stage power amplifier is improved by using a transformer, and accordingly the power efficiency of the multi-stage power amplifier is enhanced.

As set forth above, a multi-stage power amplifier according to exemplary embodiments of the invention allows for enhanced power efficiency by improving power matching among plural amplifiers included in the multi-stage power amplifier. Also, when first and second operating voltages are set to have the same voltage level, a single power circuit is required. Furthermore, when a tuning voltage in connection with a secondary coil of a transformer connected to a power amplifier is set to have the same voltage level as a gate voltage of an NMOS transistor, power efficiency is further enhanced.

While the present invention has been shown and described in connection with the exemplary embodiments, it will be apparent to those skilled in the art that modifications and variations can be made without departing from the spirit and scope of the invention as defined by the appended claims.

What is claimed is:

1. A multi-stage complementary metal oxide semiconductor (CMOS) power amplifier comprising:
   a driver amplifier having differential output terminals, inverting differential signals input through first and second input terminals and outputting the respective inverted signals through the differential output terminals;
   a transformer for power matching having a primary coil connected between the differential output terminals of the driver amplifier and a secondary coil coupled with the primary coil using electromagnetic induction, having a predetermined turns ratio to the primary coil, and connected to a direct current (DC) tuning voltage terminal; and
   a power amplifier power-amplifying differential signals passing through one end and the other end of the secondary coil of the transformer and outputting the respective power-amplified differential signals through first and second output terminals.

2. The multi-stage CMOS power amplifier of claim 1, wherein the driver amplifier comprises:
   a first inverter connected between a first operating voltage terminal and a ground and inverting a first input signal input through the first input terminal; and
   a second inverter connected between the first operating voltage terminal and the ground and inverting a second input signal input through the second input terminal.

3. The multi-stage CMOS power amplifier of claim 2, wherein the primary coil of the transformer is connected between output terminals of the first and second inverters, and
   the secondary coil of the transformer has the predetermined turns ratio to the primary coil and converts power generated from the primary coil according to the predetermined turns ratio.

4. The multi-stage CMOS power amplifier of claim 3, wherein the power amplifier comprises:
   a first amplifier connected between a second operating voltage terminal and a ground, amplifying a signal passing through the one end of the secondary coil of the transformer, and outputting the amplified signal through the first output terminal; and a second amplifier connected between the second operating voltage terminal and the ground, amplifying a signal passing through the other end of the secondary coil of the transformer, and outputting the amplified signal through the second output terminal.

5. The multi-stage CMOS power amplifier of claim 4, wherein the transformer has the tuning voltage terminal connected to an intermediate node of the secondary coil.

6. The multi-stage CMOS power amplifier of claim 5, wherein the first inverter comprises:
a first p-channel metal oxide semiconductor (PMOS) transistor having a source connected to the first operating voltage terminal, a gate connected to the first input terminal, and a drain connected to the output terminal of the first inverter; and
a first n-channel metal oxide semiconductor (NMOS) transistor having a drain connected to the output terminal of the first inverter, a gate connected to the first input terminal, and a source connected to the ground.

7. The multi-stage CMOS power amplifier of claim 6, wherein when the first PMOS transistor is turned on according to the first input signal input through the first input terminal, the first NMOS transistor is turned off according to the first input signal input through the first input terminal, and
when the first PMOS transistor is turned off according to the first input signal input through the first input terminal, the first NMOS transistor is turned on according to the first input signal input through the first input terminal.

8. The multi-stage CMOS power amplifier of claim 6, wherein the second inverter comprises:
a second PMOS transistor having a source connected to the first operating voltage terminal, a gate connected to the second input terminal, and a drain connected to the output terminal of the second inverter; and
a second NMOS transistor having a drain connected to the output terminal of the second inverter, a gate connected to the second input terminal, and a source connected to the ground.

9. The multi-stage CMOS power amplifier of claim 8, wherein when the second PMOS transistor is turned on according to the second input signal input through the second input terminal, the second NMOS transistor is turned off according to the second input signal input through the second input terminal, and
when the second PMOS transistor is turned off according to the second input signal input through the second input terminal, the second NMOS transistor is turned on according to the second input signal input through the second input terminal.

10. The multi-stage CMOS power amplifier of claim 5, wherein each of the first and second amplifiers has a cascode configuration including two amplifiers.

11. The multi-stage CMOS power amplifier of claim 5, wherein the first amplifier comprises:
a third NMOS transistor having a gate connected to the one end of the secondary coil of the transformer, a drain and a source connected to the ground; and
a fourth NMOS transistor having a drain connected to the second operating voltage terminal and the first output terminal, a gate connected to a predetermined first bias voltage terminal, and a source connected to the drain of the third NMOS transistor.

12. The multi-stage CMOS power amplifier of claim 11, wherein the second amplifier comprises:
a fifth NMOS transistor having a gate connected to the other end of the secondary coil of the transformer, a drain, and a source connected to the ground; and
a sixth NMOS transistor having a drain connected to the second operating voltage terminal and the second output terminal, a gate connected to a predetermined second bias voltage terminal, and a source connected to the drain of the fifth NMOS transistor.

13. The multi-stage CMOS power amplifier of claim 5, wherein a tuning voltage is set to have the same voltage level as a turn-on voltage of the third and fifth NMOS transistors.

14. The multi-stage CMOS power amplifier of claim 5, wherein a first operating voltage is set to have the same voltage level as a second operating voltage.

15. The multi-stage CMOS power amplifier of claim 9, wherein first and second bias voltages are set to have a voltage level higher than a turn-on voltage of the fourth and sixth NMOS transistors.

16. The multi-stage CMOS power amplifier of claim 5, wherein a tuning voltage is set to have the same voltage level as half of that of a peak-to-peak voltage of each of the signals respectively output through the one end and the other end of the secondary coil of the transformer.

* * * * *